United States Patent
Hayashi et al.

(10) Patent No.: US 9,385,702 B2
(45) Date of Patent: Jul. 5, 2016

(54) I/O MODULE

(71) Applicant: Yokogawa Electric Corporation, Musashino-shi, Tokyo (JP)

(72) Inventors: Shunsuke Hayashi, Musashino (JP); Mamoru Tamba, Musashino (JP); Takeshi Arimizu, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/936,732

(22) Filed: Nov. 10, 2015

(65) Prior Publication Data

US 2016/0134269 A1 May 12, 2016

(30) Foreign Application Priority Data

Nov. 12, 2014 (JP) ................................. 2014-229745

(51) Int. Cl.
*H03K 9/08* (2006.01)
(52) U.S. Cl.
CPC ........................................ *H03K 9/08* (2013.01)
(58) Field of Classification Search
CPC ....................................................... H03K 9/08
USPC .......................................................... 332/109
See application file for complete search history.

(56) References Cited

U.S. PATENT DOCUMENTS

| 5,289,500 A * | 2/1994 | Inou ........................ H04B 3/548 324/76.12 |
| 8,392,626 B2 | 3/2013 | Wormmeester |
| 2006/0161359 A1 | 7/2006 | Lalla |
| 2008/0018516 A1 | 1/2008 | Meagher |
| 2012/0162003 A1 * | 6/2012 | Nilsson .................. H01Q 1/225 342/124 |
| 2013/0163688 A1 | 6/2013 | Calvin |

FOREIGN PATENT DOCUMENTS

| DE | 102008054053 A1 | 5/2010 |
| EP | 2439711 A1 | 4/2012 |
| WO | 0259702 A2 | 8/2002 |

OTHER PUBLICATIONS

Office Action issued on Mar. 30, 2016, by the European Patent Office in counterpart European Application No. 15193828.9.

* cited by examiner

*Primary Examiner* — Joseph Chang
(74) *Attorney, Agent, or Firm* — Sughrue Mion, PLLC

(57) ABSTRACT

An input/output (I/O) module is configured to connect a controller and a field device. The I/O module includes a PWM (pulse width modulation) demodulator configured to demodulate a PWM signal that is input from the controller, a current source configured to output a current based on an output signal of the PWM demodulator to the field device, a resistance connected in line with the current source, and a feedback circuit configured to feed back an output current of the current source to the PWM demodulator via the controller.

6 Claims, 2 Drawing Sheets

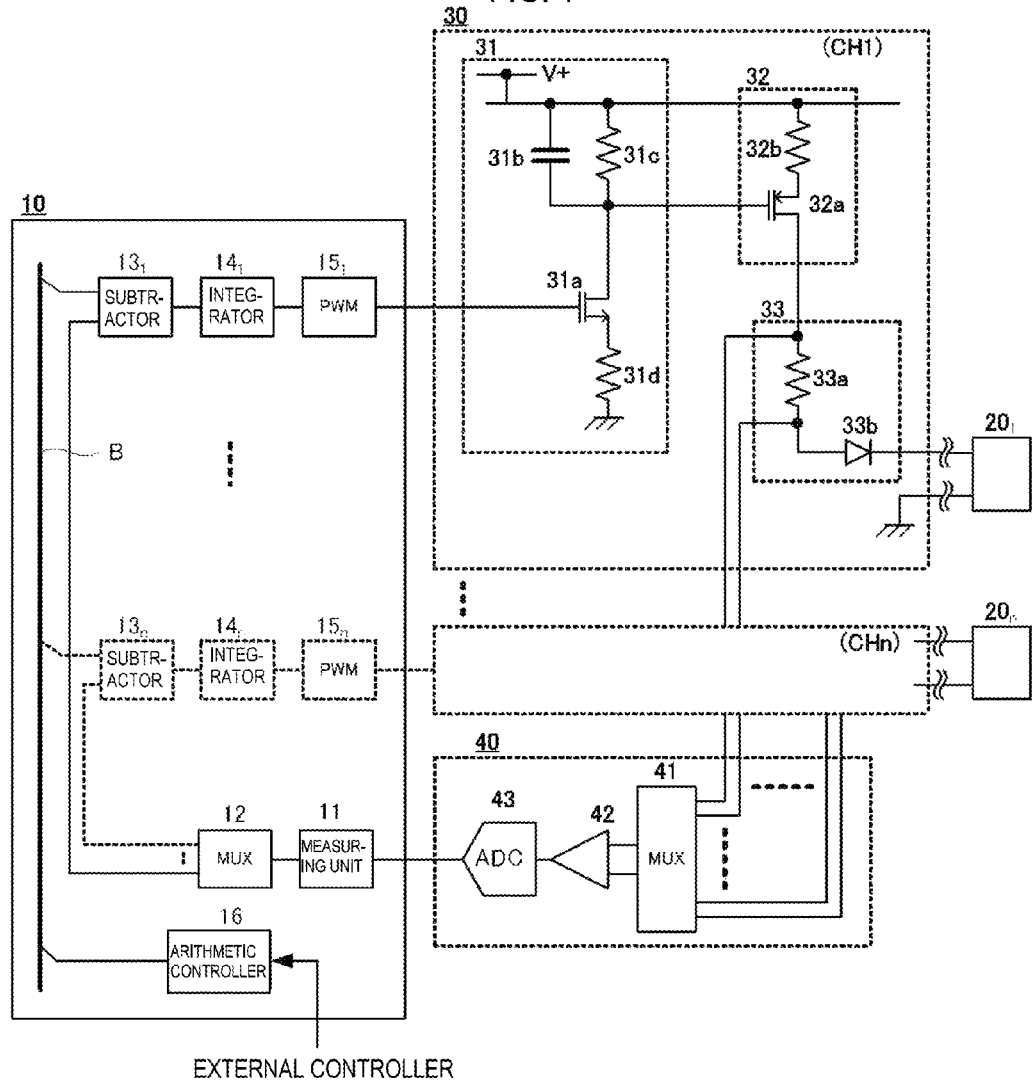

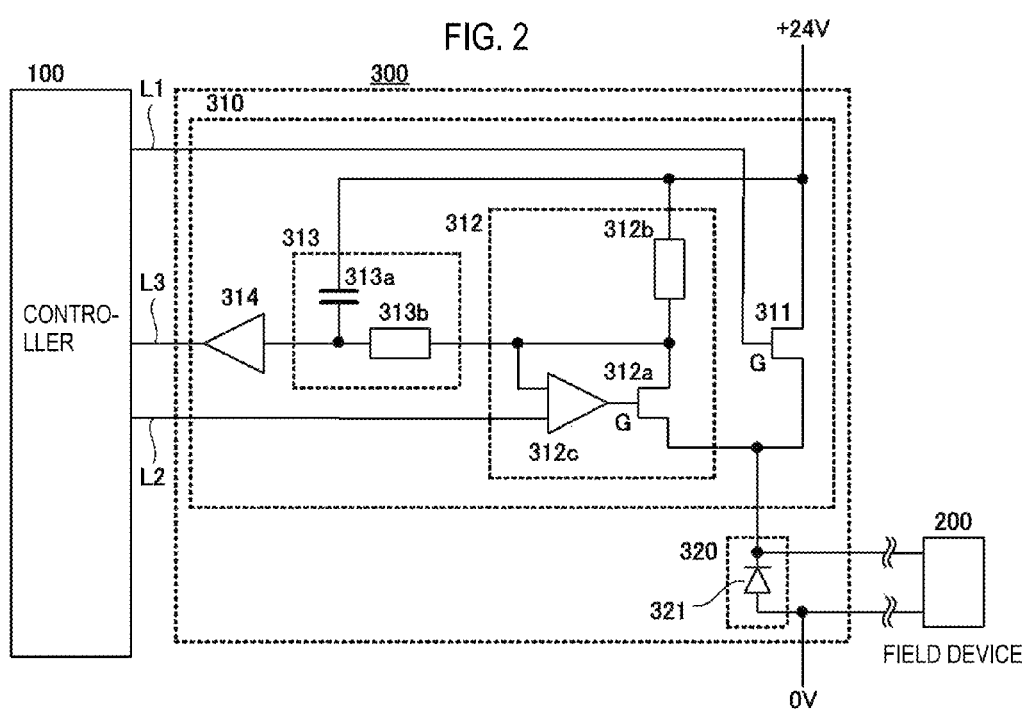

I/O MODULE

CROSS-REFERENCE TO RELATED APPLICATION

The present application claims priority from Japanese Patent Application No. 2014-229745 filed on Nov. 12, 2014, the entire content of which is incorporated herein by reference.

BACKGROUND

1. Technical Field

The present disclosure related to an input/output (I/O) module, and more specifically, to the I/O module configured to connect a controller, which configures a variety of control systems of a power plant, a manufacturing process, water and sewerage, urban gas and the like, and a field device provided at an outside of the control system.

2. Related Art

FIG. 2 is a block diagram for one channel, which depicts a connection example of a field device in a control system of the related art. In FIG. 2, a controller 100 and a field device 200 are connected via an interface circuit 300.

The interface circuit 300 has a signal unit 310 and an output unit 320.

The signal unit 310 has a FET (field effect transistor) 311 functioning as a switching element, a current source 312, a filter 313, and a buffer amplifier 314.

A source of the FET 311 is connected to a direct current power supply line of +24V, one end of a resistance 312b configuring the current source 312 and one end of a capacitor 313a configuring the filter 313. A gate of the FET 311 is connected to the controller 100. A drain of the FET 311 is connected to a cathode of a clamp diode 321 configuring the output unit 320 and a drain of a FET 312a configuring the current source 312.

The current source 312 has the FET 312a, the resistance 312b and an operational amplifier 312c.

A source of the FET 312a is directly connected to one input terminal of the operational amplifier 312c and one end of a resistance 313b configuring the filter 313 and is also connected to the source of the FET 311 and the one end of the capacitor 313a configuring the filter 313 via the resistance 312b. A drain of the FET 312a is connected to the cathode of the clamp diode 321 configuring the output unit 320 and the drain of the FET 311. A gate of the FET 312a is connected to an output terminal of the operational amplifier 312c.

The other input terminal of the operational amplifier 312c is connected to the controller 100.

The filter 313 has the capacitor 313a and the resistance 313b.

A connection point of the capacitor 313a and the resistance 313b configuring the filter 313 is connected to the controller 100 via the buffer amplifier 314.

The output unit 320 has the clamp diode 321. An anode of the clamp diode 321 is connected to a direct current power supply line of 0V, and the cathode is connected to the drain of the FET 311 and the drain of the FET 312a. Both ends of the clamp diode 321 are connected with the field device 200.

In the above circuit configuration, the controller 100 and the interface circuit 300 are configured to operate in conjunction with each other so that the connection line L1 is involved at a digital output (DO) mode, the connection line L2 is involved at an analog output (AO) mode, and the connection line L3 is involved at an analog input (AI) mode and a digital input (DI) mode, for example.

The current source 312 is used at the analog output (AO) mode, and the FET 311 functioning as the switching element is used at the digital output (DO) mode.

Patent Document 1 discloses the circuit configuration shown in FIG. 2 and operations thereof.

[Patent Document 1] U.S. Pat. No. 8,392,626B

However, according to the connection configuration of the field device of the related art shown in FIG. 2, a signal line, which is configured to transmit a control signal, of the signal lines configured to electrically connect the controller 100 and the interface circuit 300 includes an analog signal, and a signal for each function mode is provided. Therefore, the cost of the controller 100 increases and a mount area of a circuit component increases.

Also, it is necessary to separately provide the current source 312 that is to be used at the analog output (AO) mode and the FET 311 functioning as the switching element that is to be used at the digital output (DO) mode, which also increases the cost and the mount area.

Also, the current source 312 that is to be used at the analog output (AO) mode should be provided with an operational amplifier for each channel so as to keep the output precision of each channel, which also increases the cost and the mount area.

Further, since it is necessary to provide the circuit configuration of FIG. 2 for each channel, the cost and the mount area increase in proportional to the number of channels.

As a circuit size of the interface circuit 300 increases, a size of the interface circuit 300 also increases, so that the power consumption and the heat generation also increase and the system is enlarged.

The above factors are obstacles to the miniaturization of the control system that a user desires and thus are not favorable.

SUMMARY

Exemplary embodiments of the invention provide an I/O module capable of miniaturizing a control system and saving the cost thereof without adversely affecting the output precision and the like.

An input/output (I/O) module is configured to connect a controller and a field device. The I/O module comprises:

a PWM (pulse width modulation) demodulator configured to demodulate a PWM signal that is input from the controller;

a current source configured to output a current based on an output signal of the PWM demodulator to the field device;

a resistance connected in line with the current source, and a feedback circuit configured to feed back an output current of the current source to the PWM demodulator via the controller.

Based on the resistance, a threshold for a digital input may be set and a current of an analog input may be detected.

The feedback circuit may comprise an A/D converter, and a current of an analog input that is detected via the resistance may be input to the controller via the A/D converter.

The current source may comprise a series circuit of a resistance and a semiconductor switching element.

By the above configurations, it is possible to implement the I/O module capable of miniaturizing the control system and saving the cost thereof without adversely affecting the output precision and the like.

BRIEF DESCRIPTION OF THE DRAWINGS

FIG. 1 depicts a configuration of an exemplary embodiment of an I/O module of the present invention.

FIG. 2 is a block diagram depicting a connection example of a field device in a control system of the related art.

DETAILED DESCRIPTION

Hereinafter, an exemplary embodiment of the disclosure will be described in detail with reference to the drawing. FIG. 1 depicts a configuration of an exemplary embodiment of an input/output (I/O) module of the present invention. In FIG. 1, a common controller 10 and field devices 20 of a plurality of n systems are connected to each other via I/O modules 30, respectively. The current that is output from each I/O module 30 to each field device 20 is feedback input to the controller 10 via a signal conversion unit 40.

The controller 10 has a measuring unit 11, a multiplexer 12, a plurality of n measuring systems, an arithmetic controller 16, and the like. The multiplexer 12 is configured to selectively output a measured value of the measuring unit 11 to the predetermined corresponding measuring system. Each measuring system has a subtractor 13, an integrator 14 and a pulse width modulator (hereinafter, referred to as PWM modulator) 15. The arithmetic controller 16 is commonly connected to the plurality of n measuring systems via a control bus B. When one of an analog output (AO) mode in which an analog output is performed with respect to the field device 20, a digital output (DO) mode in which a digital output is performed with respect to the field device 20, an along input (AI) mode in which an analog input is performed from the field device 20, and a digital input (DI) mode in which a digital input is performed from the field device 20 is selected, the controller 10 outputs a PWM signal corresponding to the selected mode. In the meantime, the arithmetic controller 16 is connected with an external controller (not shown).

In each measuring system, one input terminal of the subtractor 13 is input with a measured value (for example, 16 bits) of each measuring system via the multiplexer 12, and the other input terminal is input with a setting value (for example, 16 bits) of each measuring system via the arithmetic controller 16 and the control bus B.

The subtractor 13 of each measuring system is configured to sequentially output a difference value between the measured value and the setting value to the integrator 14. An output value of the integrator 14 of each measuring system converges on a predetermined value associated with the setting value that is individually set for each measuring system.

The controller 10 may be configured by an FPGA (Field Programmable Gate Array), for example.

The I/O module 30 has a PWM demodulator 31, a current source 32, and an output unit 33.

The PWM demodulator 31 has a FET 31a, a parallel circuit of a capacitor 31b and a resistance 31c of which one ends are respectively connected to a drain of the FET 31a and the other ends are respectively connected to a power supply line V+, and a resistance 31d of which one end is connected to a source of the FET 31a and the other end is connected to a common potential point. A gate of the FET 31a is connected with an output terminal of the PWM modulator 15 of a predetermined measuring system.

The current source 32 has a FET 32a, and a resistance 32b of which one end is connected to a source of the FET 32a and the other end is connected to the power supply line V+. A gate of the FET 32a is connected to the drain of the FET 31a, and a drain of the FET 32a is connected to one end of a resistance 33a configuring the output unit 33.

The output unit 33 has the resistance 33a of which one end is connected to the drain of the FET 32a and the other end is connected to an anode of a diode 33b, and the diode 33b of which the anode is connected to the other end of the resistance 33a and a cathode is connected to the field device 20.

The resistance 33a of the output unit 33 is configured to function as a reference resistance for setting a threshold level at a digital input (DI) mode, and is also configured to function as a resistance for current measurement at an analog input (AI) mode.

The diode 33b of the output unit 33 functions to automatically switch the connection when the I/O module 30 and the field device 20 are duplicated. The diode 33b of the output unit 33 is connected with the field device 20.

The signal conversion unit 40 has a multiplexer 41 configured to selectively output a voltage of the resistance 33a of the output unit 33 configuring the I/O module 30 in each measuring system, a differential amplifier 42 connected to an output terminal of the multiplexer 41, and an A/D converter 43 connected to an output terminal of the differential amplifier 42 and configured to convert an output of the differential amplifier into a digital signal.

Operations of the system configured as shown in FIG. 1 are described.

a) When the I/O Module 30 is at the Digital Output (DO) Mode

By the PWM signal output from the PWM modulator 15 of the controller 10, the output current of the FET 31a configuring the PWM demodulator 31 is controlled and the output current of the FET 32a configuring the current source 32 is also controlled.

Thereby, the current corresponding to on and off of the digital output (DO) mode is output to the field device 20 through the output unit 33.

b) When the I/O Module 30 is at the Analog Input (AI) Mode

A predetermined PWM signal is provided from the PWM modulator 15 of the controller 10 to turn on the FET 31a configuring the PWM demodulator 31, so that a power supply voltage is supplied to the field device 20.

The current supplied from the current source 32 to the field device 20 is converted into the voltage by the resistance 33a configuring the output unit 33, which is then input to the signal conversion unit 40 and is converted into a digital signal by the A/D converter 43. The converted digital signal is feedback input to the measuring unit 11 of the controller 10, as an analog input measuring value.

c) When the I/O Module 30 is at the Digital Input (DI) Mode

The operations are the same as the analog input (AI) mode. The converted digital signal is used as an H/L determination value of the digital input.

d) When the I/O Module 30 is at the Analog Output (AO) Mode

The output current that is supplied from the current source 32 to the field device 20 by controlling the PWM signal is converted into the voltage by the resistance 33a configuring the output unit 33, which is then converted into a digital signal, like the analog input (AI) mode. The digital signal is compared as the measured value with the setting value and the feedback operation is repeated, so that the output current is controlled to be the same as the setting value all the time. The converted digital signal is used for monitoring the analog output value.

That is, at the analog output (AO) mode, the setting value n that is set by the controller 10 is set for each measuring system through the arithmetic controller 16. In contrast, the digital signal converted by the A/D converter 43 of the signal conversion unit 40 becomes a digital signal as the measured value n of each measuring system through the measuring unit 11 and the multiplexer 12.

The setting value n and the measured value n are input to the subtractor 13, and the subtractor 13 calculates and outputs a difference thereof. The output digital signal is input and periodically integrated in the integrator 14. An output of the integrator 14 is converted into a PWM waveform at the PWM modulator 15, and the PWM waveform output is input to the PWM demodulator 31 of the I/O module 30 in each measuring system.

The series of controls are repeatedly performed, so that the measured value of each measuring system at a normal state substantially coincides with the setting value, the output of the integrator 14 is a substantially constant value and the PWM modulation output of the PWM modulator 15 also converges on a substantially constant pulse width.

That is, it is possible to control the output current, which is to be supplied to the field device 20, to be substantially the same as the setting value by the feedback operation of each measuring system.

For example, in a configuration where the I/O modules 30 are respectively provided for all of 16 channels and the measuring systems are switched every one second, when all the channels are being used, each measuring system can be feedback controlled every 16 seconds.

Here, if only 8 channels of the 16 channels are being used, when the empty channel not connected is skipped, the feedback period of each channel being used is 8 seconds, so that it is possible to implement the high speed.

The disclosure can be summarized as follows.

1) When connecting the controller 10 and the I/O modules 30, the transmission line of the control signal at the analog output (AO) mode and the transmission line of the control signal at the digital output (DO) mode are commonly used.

2) The FET 32a functioning as the switching element of the current source 32 that is used at the analog output (AO) mode and the FET 32a functioning as the switching element that is used at the digital output (DO) mode are commonly used.

3) The operational amplifier is not used for the current source 32 that is used at the analog output (AO) mode.

The precision of the circuit configuration based on the disclosure depends on the resistance 33a of the output unit 33 and the reference voltage precision of the A/D converter 43. Here, when the resistance 33a of the output unit 33 is configured to be replaceable from an outside, it is possible to easily change a measuring range for each measuring system.

Also, according to the embodiment, the output current is monitored and adjusted for each measuring system. Therefore, the parallel operation can be performed with being connected to the output terminals of the plurality of measuring systems.

Also, according to the embodiment, it is possible to continuously monitor the output current on the basis of a voltage drop of the resistance 33a of the output unit 33 at the digital input (DI) mode and the digital output (DO) mode.

Also, since the feedback is not an analog feedback by the operational amplifier and the like, it is possible to detect a contact failure of the wiring, an access of a noise source and the like on the basis of the voltage drop of the resistance 33a of the output unit 33 at the digital input (DI) mode and the digital output (DO) mode.

As described above, according to the disclosure, it is possible to implement the four modes of the digital output (DO) mode, the analog input (AI) mode, the digital input (DI) mode and the analog output (AO) mode at the common I/O module 30 by the simple circuit configuration and the less control signals.

According to the circuit configuration of the embodiment, it is possible to reduce the circuit size with keeping the high precision without providing the operational amplifier for each measuring system, to suppress the heat generation, to save the cost and the reduce the failure occurrence.

Further, the signal conversion unit 40 is provided with the multiplexer 41, so that it is possible to commonly use the differential amplifier 42 and the A/D converter 43 in the plurality of measuring systems. In particular, in case of the multichannel (for example, 16 channels) of the measuring systems, it is possible to remarkably reduce the circuit space and the overall cost.

What is claimed is:

1. An input/output (I/O) module configured to connect a controller and a field device, the I/O module comprising:
    a PWM (pulse width modulation) demodulator configured to demodulate a PWM signal that is input from the controller;
    a current source configured to output a current based on an output signal of the PWM demodulator to the field device;
    a resistance connected in line with the current source, and
    a feedback circuit configured to feed back an output current of the current source to the PWM demodulator via the controller.

2. The I/O module according to claim 1, wherein based on the resistance, a threshold for a digital input is set and a current of an analog input is detected.

3. The I/O module according to claim 1, wherein the feedback circuit comprises an A/D converter, and a current of an analog input that is detected via the resistance is input to the controller via the A/D converter.

4. The I/O module according to claim 2, wherein the feedback circuit comprises an A/D converter, and a current of an analog input that is detected via the resistance is input to the controller via the A/D converter.

5. The I/O module according to claim 1, wherein the current source comprises a series circuit of a resistance and a semiconductor switching element.

6. The I/O module according to claim 1, wherein when one of an analog output mode in which an analog output is performed with respect to the field device, a digital output mode in which a digital output is performed with respect to the field device, an along input mode in which an analog input is performed from the field device, and a digital input mode in which a digital input is performed from the field device is selected, the controller outputs the PWM signal corresponding to the selected mode.

* * * * *